US011225729B2

(12) United States Patent
Takahashi et al.

(10) Patent No.: US 11,225,729 B2
(45) Date of Patent: *Jan. 18, 2022

(54) METHOD FOR MANUFACTURING A SILICON CARBIDE SINGLE CRYSTAL BY ADJUSTING THE POSITION OF A HOLE IN A TOP OF THE GROWTH CONTAINER RELATIVE TO THE OFF ANGLE OF THE SILICON CARBIDE SUBSTRATE

(71) Applicant: SHIN-ETSU HANDOTAI CO., LTD., Tokyo (JP)

(72) Inventors: Toru Takahashi, Annaka (JP); Hitoshi Ikeda, Chiyoda-ku (JP); Yuichi Matsumoto, Annaka (JP); Tetsuro Aoyama, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/980,144

(22) PCT Filed: Feb. 15, 2019

(86) PCT No.: PCT/JP2019/005690
§ 371 (c)(1),
(2) Date: Sep. 11, 2020

(87) PCT Pub. No.: WO2019/176444
PCT Pub. Date: Sep. 19, 2019

(65) Prior Publication Data
US 2021/0010157 A1    Jan. 14, 2021

(30) Foreign Application Priority Data

Mar. 13, 2018    (JP) .............................. JP2018-045227

(51) Int. Cl.
*C30B 23/02* (2006.01)
*C30B 29/36* (2006.01)

(52) U.S. Cl.
CPC .............. *C30B 23/02* (2013.01); *C30B 29/36* (2013.01)

(58) Field of Classification Search
CPC ....... C30B 23/00; C30B 23/002; C30B 23/02; C30B 23/025; C30B 23/06; C30B 23/063; C30B 29/00; C30B 29/10; C30B 29/36
(Continued)

(56) References Cited

U.S. PATENT DOCUMENTS

2006/0032434 A1    2/2006    Mueller et al.
2006/0107890 A1    5/2006    Hobgood et al.
(Continued)

FOREIGN PATENT DOCUMENTS

EP    2314737 A2    4/2011
EP    2388359 A2    11/2011
(Continued)

OTHER PUBLICATIONS

May 21, 2019 Search Report issued in International Patent Application No. PCT/JP2019/005690.
(Continued)

*Primary Examiner* — Kenneth A Bratland, Jr.
(74) *Attorney, Agent, or Firm* — Oliff PLC

(57) ABSTRACT

A method for manufacturing a SiC single crystal reducing crystallinity degradation at a wafer central portion wherein a growth container surrounds a heat-insulating material with a top temperature measurement hole, a seed crystal substrate at an upper portion inside the container, and a silicon carbide raw material at a lower portion of the container and sublimated to grow a SiC single crystal on the seed crystal substrate. A center position hole deviates from a center
(Continued)

position of the seed crystal substrate and moves to the periphery side of the center of the seed crystal substrate. A SiC single crystal substrate surface is tilted by a {0001} plane and used as the seed crystal substrate. The SiC single crystal grows with the seed crystal substrate directed to a normal vector of the seed crystal substrate basal plane parallel to the main surface and identical to the hole in a cross-sectional view.

4 Claims, 5 Drawing Sheets

(58) Field of Classification Search
USPC ........ 117/84–85, 88, 94, 101, 106, 200–201, 117/204, 937, 951
See application file for complete search history.

(56) References Cited

U.S. PATENT DOCUMENTS

| | | |
|---|---|---|
| 2013/0280466 A1 | 10/2013 | Zwieback et al. |
| 2016/0138186 A1 | 5/2016 | Hori et al. |
| 2017/0191183 A1 | 7/2017 | Sasaki |
| 2017/0260647 A1 | 9/2017 | Ujihara et al. |
| 2017/0342593 A1* | 11/2017 | Sato ...................... C01B 32/963 |
| 2020/0332436 A1* | 10/2020 | Ikeda ...................... C30B 23/06 |

FOREIGN PATENT DOCUMENTS

| | | |
|---|---|---|
| EP | 2851456 A1 | 3/2015 |
| JP | 2000-191399 A | 7/2000 |
| JP | 2005-239465 A | 9/2005 |
| JP | 2008-001532 A | 1/2008 |
| JP | 2012-131679 A | 7/2012 |
| JP | 2012131679 A * | 7/2012 |
| JP | 2017-105676 A | 6/2017 |

OTHER PUBLICATIONS

Jun. 17, 2021 Office Action issued in Chinese Patent Application No. 201980018916.0.
Oct. 22, 2021 Extended European Search Report issued in European Patent Application No. 19768426.9.

* cited by examiner

[FIG. 1]
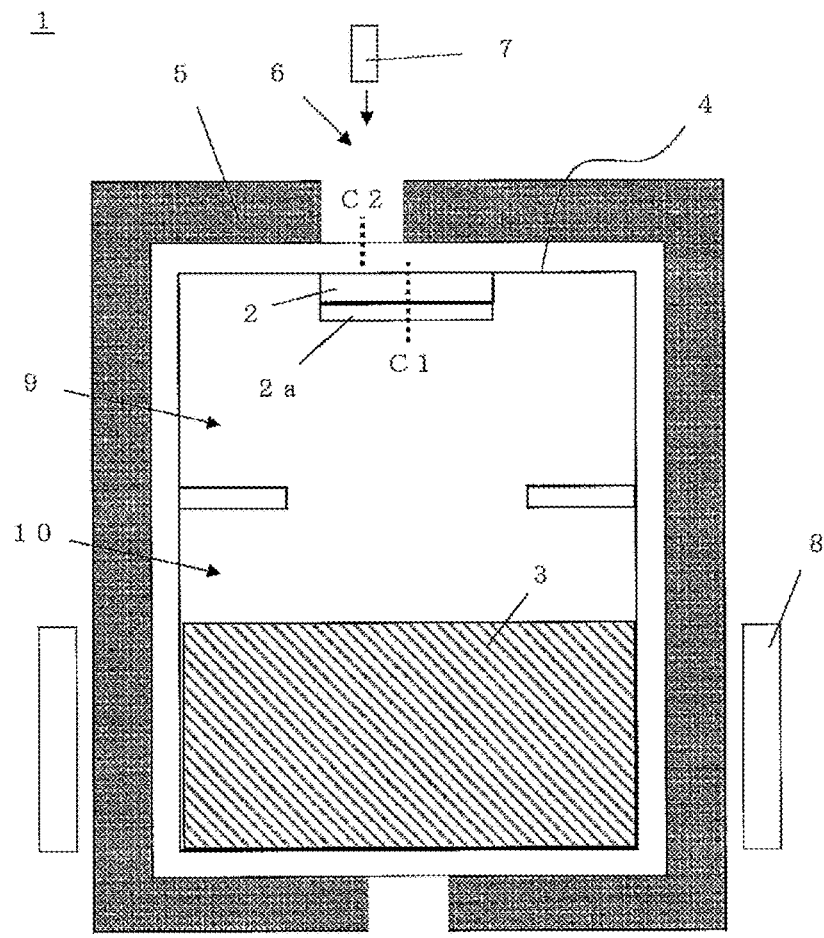
[FIG. 2]
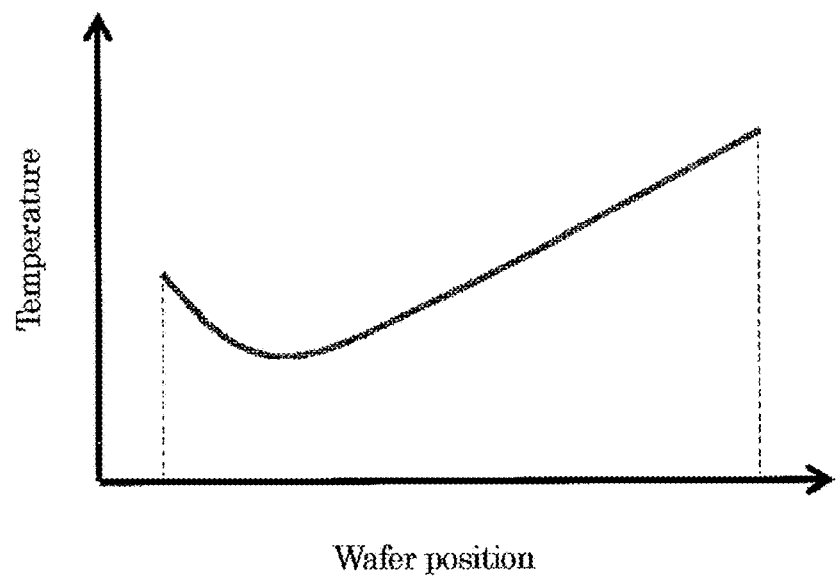

[FIG. 3]
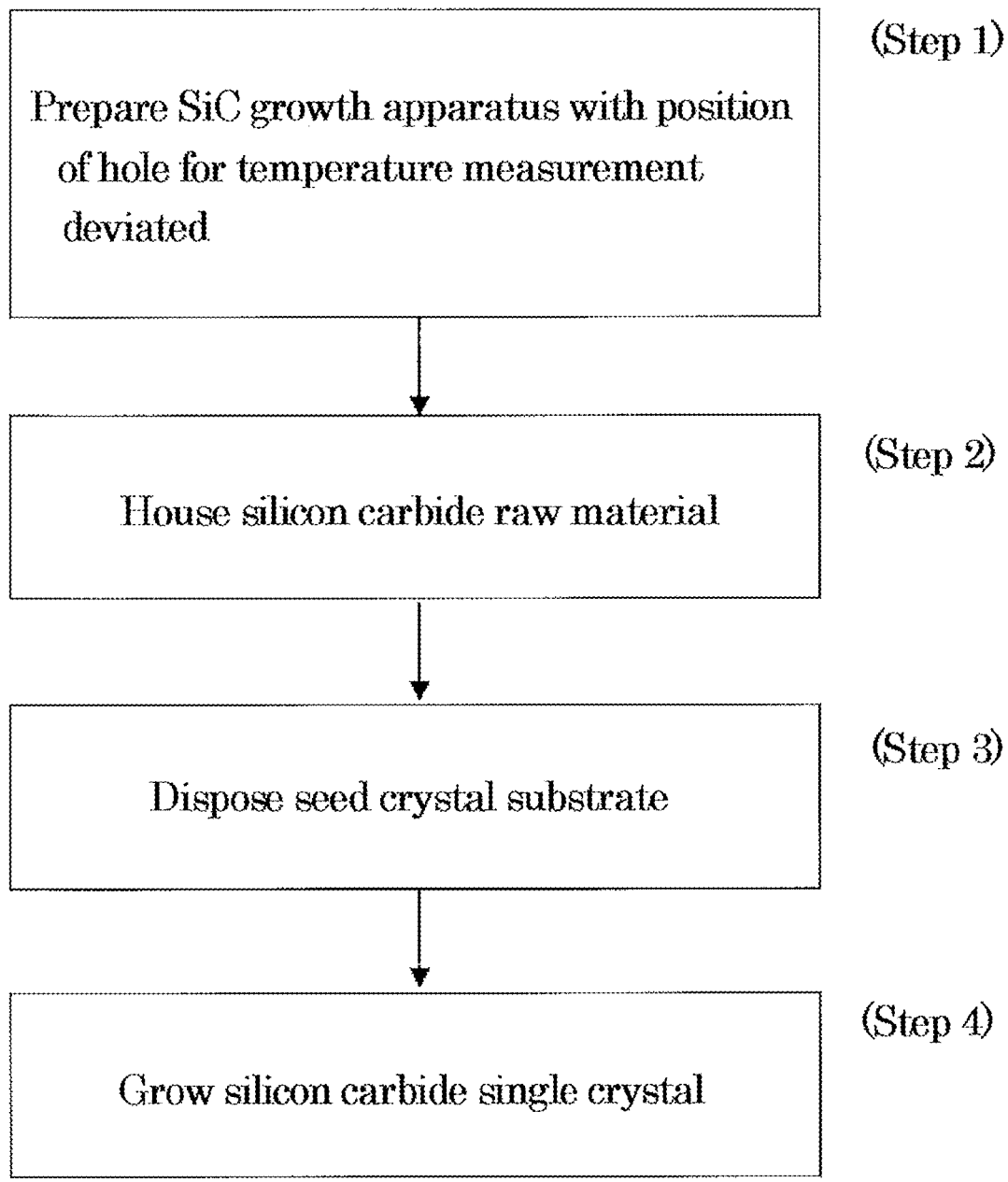

[FIG. 4]
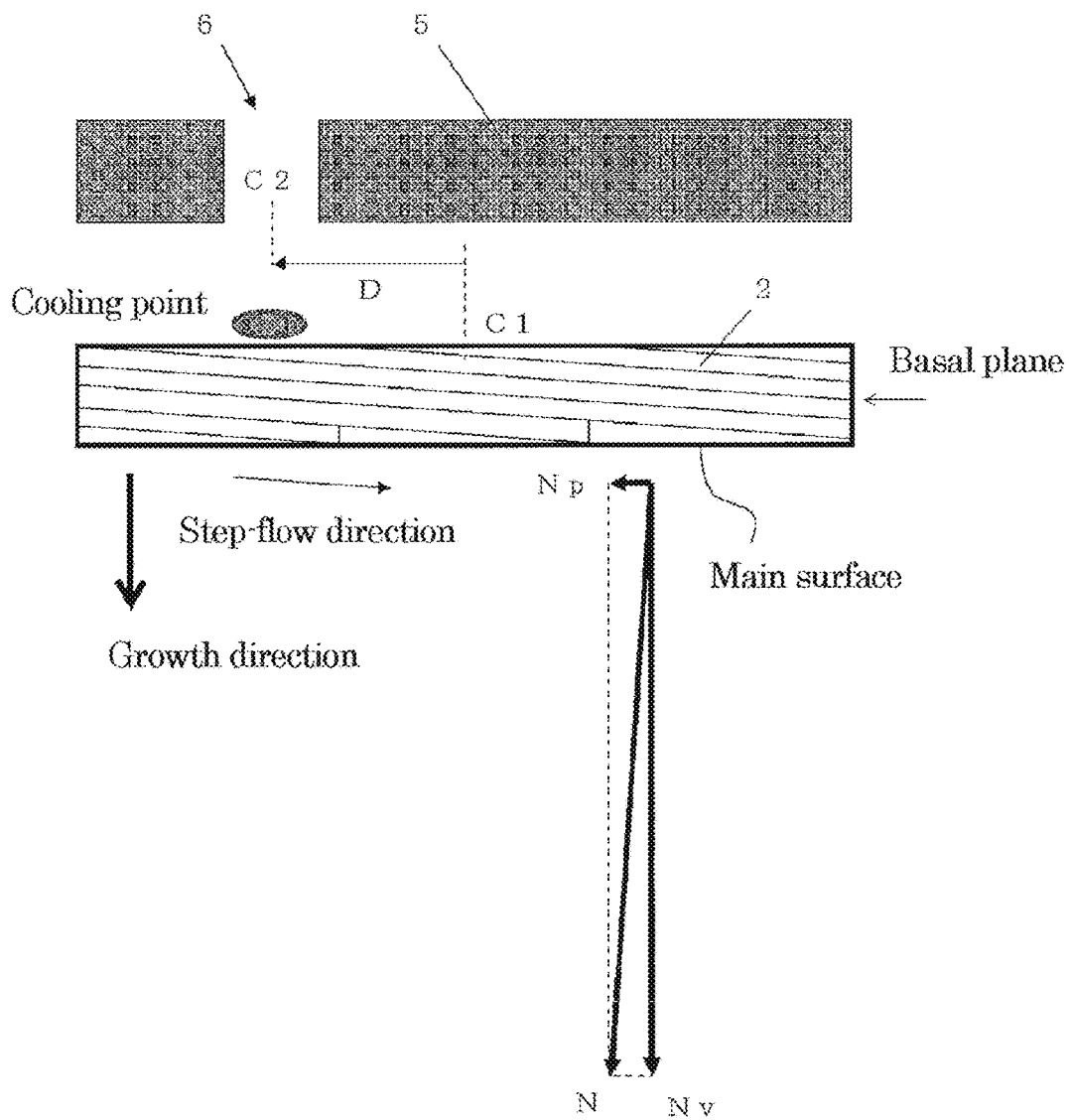
[FIG. 5]
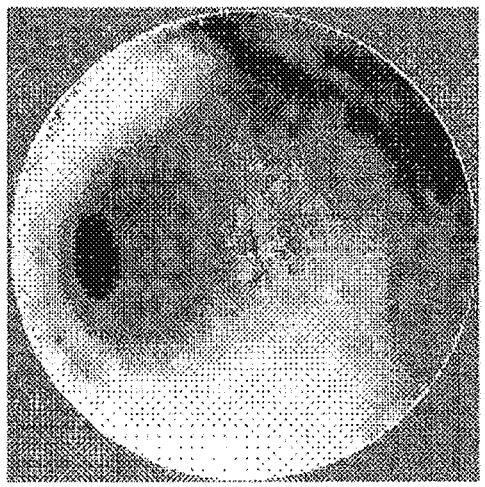

[FIG. 6]
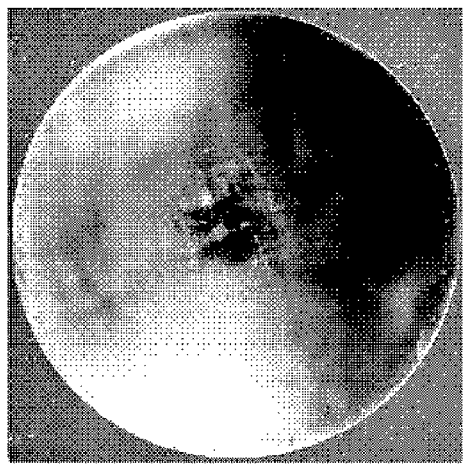
[FIG. 7]
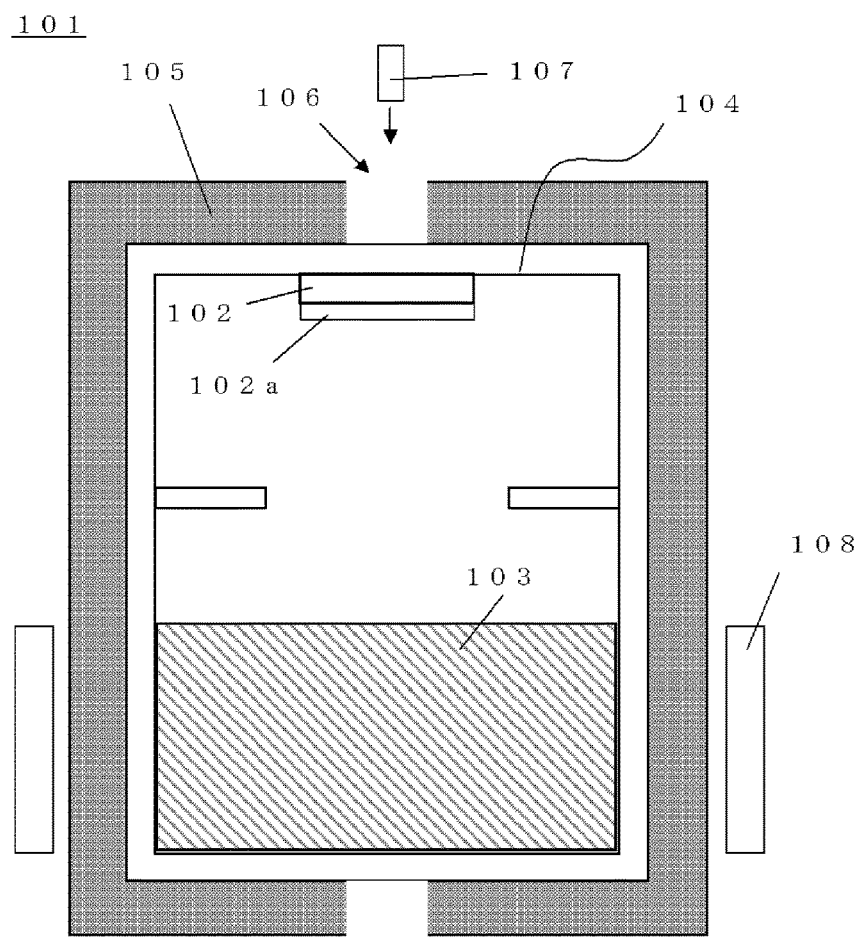
PRIOR ART

[FIG. 8]
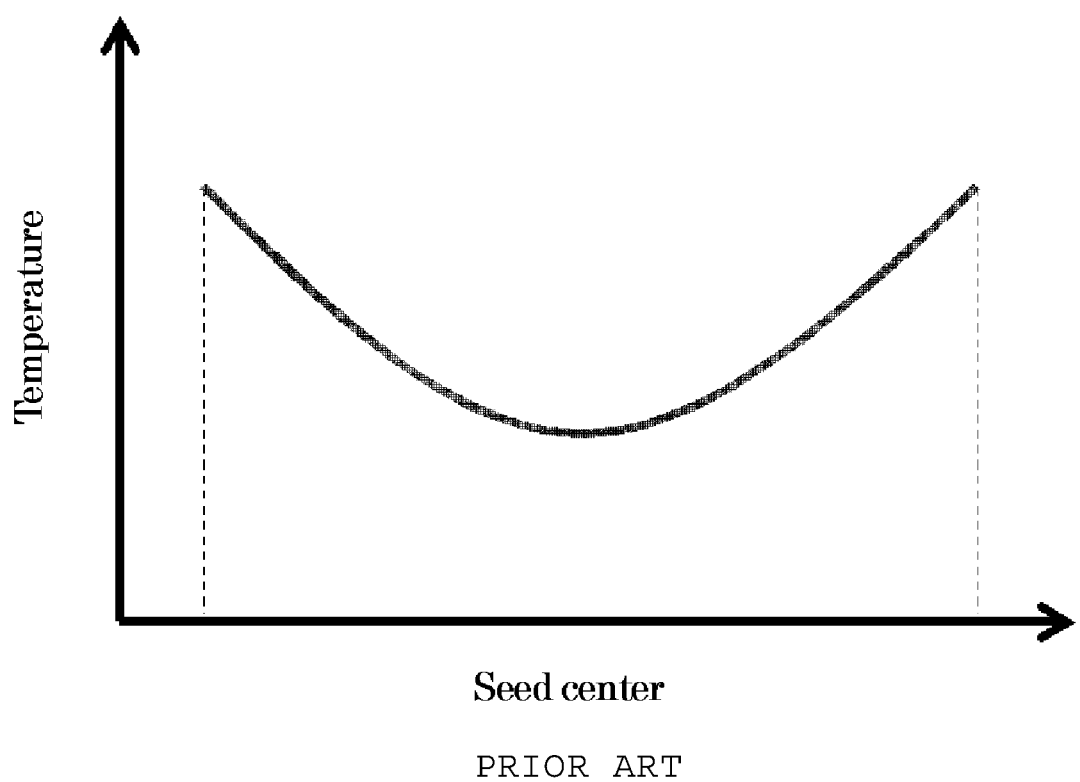
PRIOR ART

METHOD FOR MANUFACTURING A SILICON CARBIDE SINGLE CRYSTAL BY ADJUSTING THE POSITION OF A HOLE IN A TOP OF THE GROWTH CONTAINER RELATIVE TO THE OFF ANGLE OF THE SILICON CARBIDE SUBSTRATE

TECHNICAL FIELD

The present invention relates to a method for manufacturing a silicon carbide single crystal in which a silicon carbide single crystal is grown by a sublimation method.

BACKGROUND ART

Recently, inverter circuits have been commonly used in electric vehicles and electric air-conditioners. This creates demands for semiconductor crystal of silicon carbide (hereinafter may also be referred to as SiC) because of the properties of less power loss and higher breakdown voltage in devices than those using semiconductor Si crystal.

As a typical and practical method for growing a crystal with a high melting point or a crystal that is difficult to grow by liquid phase growth such as SiC, a sublimation method exists. In this method, a solid raw material is sublimated in a container at a high temperature around 2000° C. or higher, and a crystal is grown on a seed crystal located on the opposite side (Patent Document 1).

However, SiC crystal growth requires high temperature for the sublimation, and the growth apparatus requires temperature control at the high temperature. Moreover, to stabilize the pressure of the sublimated substance, it is necessary to steadily control the pressure inside the container. Further, SiC crystal growth depends on the sublimation rate, and the growth rate is relatively quite slow in comparison with Czochralski method for Si, LPE manufacturing method for GaAs and so forth, for example. Hence, long time is required for the growth. Fortunately, the developments of control units, computers, personal computers, and so forth nowadays enable long-term steady adjustments of pressure and temperature.

Specifically, a method for growing SiC by sublimation is performed using a SiC growth apparatus 101 as shown in FIG. 7. A silicon carbide raw material 103 is put in a growth container 104, and heated with a heater 108. Thus, a crystal (silicon carbide single crystal 102*a*) is grown on a seed crystal substrate 102 disposed inside the growth container 104.

The growth container 104 is disposed in a vacuum quartz tube or a vacuum chamber, and filled with a gas with low reactivity once. The atmosphere is lower than the atmospheric pressure so as to increase the SiC sublimation rate.

Outside the growth container 104, a heat-insulating material 105 is disposed. At least one hole 106 for measuring the temperature with a thermometer (pyrometer) 107 is provided to a portion of the heat-insulating material 105. Hence, some heat escapes through the hole.

This hole is located at a position corresponding to a central portion of the seed crystal substrate 102. The in-plane temperature distribution of the seed crystal substrate 102 is as shown in FIG. 8, and the temperature is the lowest at the central portion. Since single crystal grows spirally from the center to the outside, threading dislocation (screw dislocation) is often generated.

The growth container 104 is mainly made of a carbon material and is air permeable, and the pressures inside and outside the growth container are equal.

In practice, the silicon carbide raw material is disposed at the bottom of the growth container. The raw material is solid, and sublimates at high temperature under reduced pressure. The sublimated material grows as a single crystal on the seed crystal substrate located on the opposite side (disposed at the top). In the case of SiC, the single crystal includes cubic, hexagonal crystals, for example. Further, among hexagonal crystals, 4H, 6H, and so forth are known as typical polytypes.

In many cases, single crystal grows on the same type like 4H grows on a 4H type (Patent Document 2).

At the center of a SiC single crystal obtained by the method for growing a SiC single crystal as described above, facet is formed and grows with screw dislocation functioning as the driving force, so that many defects are present. If such growth is repeated, degradation of the crystallinity at the central portion occurs and develops.

A device using a substrate with such crystallinity degradation exhibits considerably poorer performance. For example, when a light-emitting diode is made, leak current is increased and luminous intensity is lowered. In addition, it is reported that breakdown voltage is not maintained in a high-power device. Therefore, in order to improve the performance of a device using a SiC single crystal substrate, or to improve the yield within the wafer, it is important to reduce such degradation of crystallinity at the central portion.

CITATION LIST

Patent Literature

Patent Document 1: Japanese Unexamined Patent Application Publication No. 2000-191399
Patent Document 2: Japanese Unexamined Patent Application Publication No. 2005-239465

SUMMARY OF INVENTION

Technical Problem

The present invention has been made in view of the above-described problems. An object of the present invention is to provide a method for manufacturing a silicon carbide single crystal to reduce crystallinity degradation at a central portion of a wafer.

Solution to Problem

To achieve the object, the present invention provides a method for manufacturing a silicon carbide single crystal in which a growth container is surrounded by a heat-insulating material with a hole for temperature measurement provided in a top portion thereof, a seed crystal substrate is disposed at a center of an upper portion inside the growth container, a silicon carbide raw material is disposed at a lower portion of the growth container, and the silicon carbide raw material is sublimated to grow a silicon carbide single crystal on the seed crystal substrate, wherein to allow a position of a center of the hole for temperature measurement in the heat-insulating material to deviate from a position of a center of the seed crystal substrate disposed inside the growth container, the hole for temperature measurement is provided to deviate to a position on a periphery side relative to the center of the seed crystal substrate disposed inside the growth container, a silicon carbide single crystal substrate having a main surface tilted by an off angle from a {0001} plane which is a basal plane is used as the seed crystal substrate, and the silicon carbide single crystal is grown with the seed crystal substrate disposed inside the growth container so that a direction in which a component of a normal vector of the basal plane of the seed crystal substrate is parallel to the main surface of the seed crystal substrate is identical to an eccentric direction of the center of the hole for temperature measurement relative to the center of the seed crystal substrate in a cross-sectional view including the center of the seed crystal substrate inside the growth container and the center of the hole for temperature measurement in the heat-insulating material.

Making the hole for temperature measurement eccentric as described above shifts the lowest temperature region on the seed crystal substrate from the center and increases a region where a SIC single crystal grows in a step-flow direction. This enables growth of a SIC single crystal with which degradation of the crystallinity at a wafer central portion is reduced.

In this event, the off angle of the seed crystal substrate may be 0.5 to 10 degrees.

Such an off angle allows efficient performance of step-flow growth.

Further, the hole for temperature measurement in the heat-insulating material may be provided so that the center of the hole is positioned more towards the periphery side than a one-third-radius position of the seed crystal substrate from the center of the seed crystal substrate disposed inside the growth container.

In this manner, the silicon carbide single crystal can be grown in the step-flow direction at a wafer central portion with more certainty, and the silicon carbide single crystal with few penetration defects and reduced crystallinity degradation can be grown.

Advantageous Effects of Invention

As described above, the inventive method for manufacturing a silicon carbide single crystal makes it possible to manufacture a silicon carbide single crystal to reduce crystallinity degradation at a wafer central portion.

BRIEF DESCRIPTION OF DRAWINGS

FIG. 1 is a schematic cross-sectional view showing an example of a SiC growth apparatus with which the inventive method for manufacturing a silicon carbide single crystal can be carried out.

FIG. 2 is a graph showing a relation between the position of a seed crystal substrate and the temperature distribution in the present invention.

FIG. 3 is a process chart showing an example of the flow of the inventive method for manufacturing a silicon carbide single crystal.

FIG. 4 is an explanatory diagram showing a disposition direction of the seed crystal substrate in the present invention.

FIG. 5 is a measurement image showing a wafer-plane-distortion distribution in Example.

FIG. 6 is a measurement image showing a wafer-plane-distortion distribution in Comparative Example.

FIG. 7 is a schematic cross-sectional view showing an example of a SiC growth apparatus used in conventional methods.

FIG. 8 is a graph showing a relation between the position of a seed crystal substrate and the temperature distribution in the conventional SIC growth apparatus.

DESCRIPTION OF EMBODIMENTS

As described above, the present inventors have studied to reduce the crystallinity degradation at a central portion of a wafer, and consequently found that the crystallinity degradation at a wafer central portion is reduced by the following method for manufacturing a silicon carbide single crystal. In this method, a growth container is surrounded by a heat-insulating material with a hole for temperature measurement provided in a top portion thereof, a seed crystal substrate is disposed at a center of an upper portion inside the growth container, a silicon carbide raw material is disposed at a lower portion of the growth container, and the silicon carbide raw material is sublimated to grow a silicon carbide single crystal on the seed crystal substrate, wherein to allow a position of a center of the hole for temperature measurement in the heat-insulating material to deviate from a position of a center of the seed crystal substrate disposed inside the growth container, the hole for temperature measurement is provided to deviate to a position on a periphery side relative to the center of the seed crystal substrate disposed inside the growth container, a silicon carbide single crystal substrate having a main surface tilted by an off angle from a {000} plane which is a basal plane is used as the seed crystal substrate, and the silicon carbide single crystal is grown with the seed crystal substrate disposed inside the growth container so that a direction in which a component of a normal vector of the basal plane of the seed crystal substrate is parallel to the main surface of the seed crystal substrate is identical to an eccentric direction of the center of the hole for temperature measurement relative to the center of the seed crystal substrate in a cross-sectional view including the center of the seed crystal substrate inside the growth container and the center of the hole for temperature measurement in the heat-insulating material. This finding has led to the completion of the present invention.

Hereinafter, the present invention will be described in detail with reference to the drawings as an example of embodiments. However, the present invention is not limited thereto.

FIG. 1 is a schematic cross-sectional view showing an example of a SiC growth apparatus with which the inventive method for manufacturing a silicon carbide single crystal can be carried out.

As shown in FIG. 1, a SiC growth apparatus 1 according to the present invention includes a growth container 4 for housing a seed crystal substrate 2 and a silicon carbide raw material (also referred to as SiC raw material) 3, a heat-insulating material 5 surrounding the growth container 4, a thermometer 7 for measuring the temperature inside the growth container 4 via a hole 6 for temperature measurement (hereinafter also referred to simply as hole) provided through the heat-insulating material 5, and a heater 8 for heating the SiC raw material.

The growth container 4 has a growth chamber 9 for disposing the seed crystal substrate 2, and a sublimation chamber 10 for disposing the SiC raw material 3, and is formed of, for example, heat-resistant graphite. In addition, during crystal growth, a crystal is grown (growth of a silicon carbide single crystal 2a) in an inert gas atmosphere under reduced pressure by setting the growth container 4 in a quartz tube or chamber not shown in the drawing and supplying an inert gas such as Ar while vacuum exhausting. In this event, in the case of an n type, nitrogen may be added.

As the heater 8, a heater for performing RH (resistance heating) or RF (radio-frequency) heating can be used. In addition, by using a pyrometer as the thermometer 7, the temperature measurement can be performed with precision through the hole 6 for temperature measurement in the heat-insulating material 5 from outside the growth container 4 without contact.

Here, the positions of the seed crystal substrate and the hole for temperature measurement in the heat-insulating material inside the SiC growth apparatus according to the present invention will be described in detail.

In the present invention, the seed crystal substrate is disposed inside the growth container, more specifically, disposed at the center of an upper portion inside the growth container as shown in FIG. 1.

Moreover, the hole for temperature measurement is provided in a top portion of the heat-insulating material. More specifically, to allow a position C2 of the center of the hole to deviate from a position C1 of the center of the seed crystal substrate inside the growth container (in other words, a center position in the upper portion of the growth container) as shown in FIG. 1, the hole is provided to deviate to a position on a periphery side relative to the center C1 of the seed crystal substrate inside the growth container.

Note that, here, the position C2 of the center of the hole for temperature measurement, which is a through-hole provided in the top portion of the heat-insulating material, and which connects the outside and the inside of the heat-insulating material, refers to a center position on an inner side (seed crystal substrate side), in a cross section, of the heat-insulating material.

The hole is preferably provided so that the center position C2 of the hole for temperature measurement in the heat-insulating material is positioned more towards the periphery side than a one-third-radius position of the seed crystal substrate from the center position C1 of the seed crystal substrate, but not positioned at the center position C1.

By disposing the center position C2 of the hole for temperature measurement outwardly of the center position C1 as described above, the location of the seed crystal substrate corresponding to the position of the hole becomes the coolest as shown in FIG. 2. This coolest position can be set outside the area corresponding to ⅓ of the radius of the seed crystal substrate. Moreover, this position serves as growth starting point of the silicon carbide single crystal.

Hereinafter, the inventive method for manufacturing a silicon carbide single crystal by a sublimation method will be described with reference to the process chart of FIG. 3.

First, a SiC growth apparatus 1 is prepared with a hole 6 for temperature measurement in a deviated position as in FIG. 1 (Step 1). Specifically, an apparatus is prepared which has the hole 6 provided to deviate to a position on the periphery side relative to the center position C1 of the seed crystal substrate 2 so as to allow the center position C2 of the hole 6 for temperature measurement to deviate from the center position C1 of the seed crystal substrate 2 to be disposed later (the center position in the upper portion of the growth container).

Next, the SiC raw material 3 is housed in the sublimation chamber 10 inside the growth container 4 (Step 2), and the seed crystal substrate 2 is prepared and disposed at the center position of the upper portion in the growth chamber 9 (Step 3). Here, a silicon carbide single crystal substrate having a main surface tilted by an off angle from a {0001} plane which is a basal plane is prepared as the seed crystal substrate 2. Moreover, the degree of this off angle is not particularly limited, but may be 0.5 to 10 degrees, for example. Using such a seed crystal substrate 2 makes step-flow growth possible. Furthermore, the relation between the disposition positions of the seed crystal substrate 2 or the hole 6 for temperature measurement and the disposition direction of the seed crystal substrate 2 to be described in detail later makes it possible to reduce distortion and penetration defects in the silicon carbide single crystal 2a to be grown. Moreover, setting the off angle to the above-described value enables more efficient step-flow growth.

In addition, the manner in which the seed crystal substrate 2 is disposed in this event (direction of disposition) will be described with reference to FIG. 4. FIG. 4 is a diagram explaining the disposition direction of the seed crystal substrate 2. Here, only the hole 6 for temperature measurement and the seed crystal substrate 2 disposed at the center of the upper portion of the growth container 4 are simply described. Note that FIG. 4 is a cross-sectional view including the center C1 of the seed crystal substrate and the center C2 of the hole for temperature measurement. In addition, a single crystal substrate having a crystal growth plane tilted from the {0001} plane, which is a basal plane, by 0.5 to 10 degrees in a <11-20> direction is given as an example of the seed crystal substrate 2.

As described above, the seed crystal substrate itself has the main surface tilted by an off angle from the basal plane. Accordingly, a normal vector N of the basal plane is tilted from a direction perpendicular to the main surface of the seed crystal substrate 2, and can be resolved in a component Nv in the direction perpendicular to the main surface and a component Np in a direction parallel to the main surface. In this example, the component Np in the direction parallel to the main surface points to the left.

Incidentally, considering the center position C2 of the hole for temperature measurement, the center position C2 deviates from the center position C1 of the seed crystal substrate as described above. Here, the direction of this deviation is defined as an eccentric direction D. In this example, the eccentric direction D points to the left.

In the present invention, the direction of the seed crystal substrate is adjusted and arranged so that the above-described Np (here, pointing left) and D (here, pointing left) are in an identical direction, as shown in FIG. 4.

Next, for example, argon and nitrogen gases are allowed to flow to set a pressure of 1 to 20 torr (1.3 hPa to 2.7×10 hPa), and a SiC single crystal 2a is grown on the seed crystal substrate 2 at a temperature of 2000 to 2300° C. by heating with a heater (Step 4).

In this event, as described in FIG. 4 as a cooling point, the location on the seed crystal substrate 2 corresponding to the position of the hole 6 for temperature measurement has the lowest temperature, and the position having the lowest temperature becomes the starting point of the silicon carbide single crystal growth. In the case of FIG. 4, the range to the right of the cooling point is wider than the range to the left of the cooling point. In this wide range, the crystal will grow in the step-flow direction in the direction parallel to the main surface.

Thus, by such a manufacturing method of the present invention, a favorable silicon carbide single crystal with few penetration defects and less crystallinity degradation at a wafer central portion can be manufactured. In addition, distortion that occurs in the plane of a silicon carbide single crystal manufactured by a conventional method can be suppressed.

Note that in FIG. 1 and FIG. 4, an example is shown in which the hole 6 is provided so that the center position C2 of the hole for temperature measurement is near a one-half-radius position of the seed crystal substrate 2 from the center position C1 of the seed crystal substrate. However, it is sufficient if the hole deviates to a position towards the periphery side. The hole may be provided at a position corresponding to an outer edge of the seed crystal substrate 2, and the degree of deviation is not particularly limited. Nevertheless, as stated above, the center position C2 of the hole is preferably positioned more towards the periphery side than the one-third-radius position of the seed crystal substrate from the center position C1 of the seed crystal substrate, more preferably positioned more towards the periphery side than the one-half-radius position of the seed crystal substrate. In this manner, the silicon carbide single crystal can be grown in the step-flow direction in a wide range on the seed crystal substrate plane with more certainty when the silicon carbide single crystal 2a is actually grown on the seed crystal substrate 2. Accordingly, a silicon carbide single crystal with even less distortion and penetration defects can be obtained with more certainty.

EXAMPLE

Hereinafter, the present invention will be more specifically described with reference to Example and Comparative Example. However, the present invention is not limited thereto.

Example

Using the SiC growth apparatus shown in FIG. 1, a SiC single crystal with a diameter of 4 inches (100 mm) was grown under the following growth conditions by the inventive method for manufacturing a silicon carbide single crystal.
<Conditions>
Seed crystal substrate . . . SiC single crystal substrate with a diameter of 4 inches (100 mm) having a main surface tilted from the {0001} plane by 4° in the <11-20> direction
Growth temperature . . . 2200° C.
Pressure . . . 10 Torr (1.3×10 hPa)
Atmosphere . . . argon and nitrogen gases Note that, as shown in FIG. 1, the hole for temperature measurement was opened at a location corresponding to a one-half-radius position of the seed crystal substrate from the center of the seed crystal substrate. Moreover, as shown in FIG. 4, the seed crystal substrate was disposed so that the direction in which the component of the normal vector in the crystal growth direction of the basal plane of the seed crystal substrate was parallel to the main surface of the seed crystal substrate was identical to the eccentric direction of the hole, and crystal growth was performed.

After the SiC single crystal growth, a wafer cut out with a multi-wire saw was ground, mirror-polished, and CMP polished. Then, the distribution of distortion on the plane was investigated by photoelasticity evaluation. The result is shown in FIG. 5.

Further, the crystallinity at a central portion of the wafer was investigated. The result is shown in Table 1.

Comparative Example

A SiC growth apparatus as shown in FIG. 7 was prepared to manufacture a silicon carbide single crystal by a conventional method for manufacturing a silicon carbide single crystal. A SiC single crystal with a diameter of 4 inches (100 mm) was grown under the same conditions as in Example, except that the apparatus as shown in FIG. 7 was used with a hole opened so that the center position of the hole for temperature measurement corresponded to the center of a seed crystal substrate and that a SiC single crystal substrate having the {0001} plane as the main surface was used as the seed crystal substrate.

After the SiC single crystal growth, a wafer cut out with a multi-wire saw was ground, mirror-polished, and CMP polished. Then, the distribution of distortion on the plane was investigated by photoelasticity evaluation. FIG. 6 shows the result. Further, the crystallinity at a central portion of the wafer was investigated as in Example. Table 1 shows the result.

TABLE 1

| | Crystallinity near Center (Half Width based on Rocking Curve by XRD) | |
|---|---|---|
| Coordinates | Comparative Example | Example |
| (−5, 0) | 123 sec | 44 sec |
| (0, 0) | 152 sec | 48 sec |
| (0, +5) | 144 sec | 63 sec |
| Average | 139 sec | 52 sec |

The results shown in FIGS. 5, 6 reveal that the distortions in the central portion and the peripheral portion of the wafer plane are weakened in Example compared to Comparative Example.

Moreover, from Table 1, the half width values at the coordinates in Example are remarkably smaller than those in Comparative Example. This shows that the wafer of Example has flat plane in comparison with Comparative Example, and the crystallinity is improved.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a silicon carbide single crystal in which a growth container is surrounded by a heat-insulating material with a hole for temperature measurement provided in a top portion thereof, a seed crystal substrate is disposed at a center of an upper portion inside the growth container, a silicon carbide raw material is disposed at a lower portion of the growth container, and the silicon carbide raw material is sublimated to grow a silicon carbide single crystal on the seed crystal substrate, wherein
   to allow a position of a center of the hole for temperature measurement in the heat-insulating material to deviate from a position of a center of the seed crystal substrate disposed inside the growth container, the hole for temperature measurement is provided to deviate to a position on a periphery side relative to the center of the seed crystal substrate disposed inside the growth container,
   a silicon carbide single crystal substrate having a main surface tilted by an off angle from a {0001} plane which is a basal plane is used as the seed crystal substrate, and
   the silicon carbide single crystal is grown with the seed crystal substrate disposed inside the growth container so that a direction of a component of a normal vector of the basal plane of the seed crystal substrate parallel to the main surface of the seed crystal substrate is identical to an eccentric direction of the center of the hole for temperature measurement relative to the center of the seed crystal substrate in a cross-sectional view including the center of the seed crystal substrate inside the growth container and the center of the hole for temperature measurement in the heat-insulating material.

2. The method for manufacturing a silicon carbide single crystal according to claim 1, wherein the off angle of the seed crystal substrate is 0.5 to 10 degrees.

3. The method for manufacturing a silicon carbide single crystal according to claim 1, wherein the hole for temperature measurement in the heat-insulating material is provided so that the center of the hole is positioned more towards the periphery side than a one-third-radius position of the seed crystal substrate from the center of the seed crystal substrate disposed inside the growth container.

4. The method for manufacturing a silicon carbide single crystal according to claim 2, wherein the hole for temperature measurement in the heat-insulating material is provided so that the center of the hole is positioned more towards the periphery side than a one-third-radius position of the seed crystal substrate from the center of the seed crystal substrate disposed inside the growth container.

* * * * *